United States Patent [19]

Matsushita et al.

[11] Patent Number: 5,323,041

[45] Date of Patent: Jun. 21, 1994

[54] HIGH-BREAKDOWN-VOLTAGE SEMICONDUCTOR ELEMENT

[75] Inventors: Ken'ichi Matsushita, Yokohama; Ichiro Omura, Kawasaki; Akio Nakagawa, Hiratsuka, all of Japan

[73] Assignee: Kabushiki Kaisha Toshiba, Kawasaki, Japan

[21] Appl. No.: 901,111

[22] Filed: Jun. 19, 1993

[30] Foreign Application Priority Data

Jun. 21, 1991 [JP] Japan .................................. 3-150576

[51] Int. Cl.$^5$ ...................... H01L 27/02; H01L 29/10; H01L 29/78
[52] U.S. Cl. .................................................. 257/339
[58] Field of Search ............... 257/394, 493, 630, 409, 257/487, 635, 632, 339, 489

[56] References Cited

U.S. PATENT DOCUMENTS

| H665 | 8/1989 | Knolle et al. | 257/630 |
|---|---|---|---|
| 3,686,544 | 8/1972 | Steigman et al. | 257/394 |
| 4,890,150 | 12/1989 | Vera et al. | 357/52 |
| 5,086,332 | 2/1992 | Nakagawa et al. | 357/51 |
| 5,204,988 | 4/1993 | Sakurai | 257/356 |

FOREIGN PATENT DOCUMENTS

| 0224968 | 6/1987 | European Pat. Off. | 257/409 |
|---|---|---|---|
| 0279605 | 8/1988 | European Pat. Off. | 257/409 |
| 0400934 | 12/1990 | European Pat. Off. | 257/409 |
| 3024939 | 1/1981 | Fed. Rep. of Germany | 257/409 |
| 56-81930 | 7/1981 | Japan | 257/409 |

OTHER PUBLICATIONS

Patent Abstracts of Japan, vol. 14, No. 133 (E-902), Mar. 13, 1990, JP-2 001 980, Jan. 8, 1990.

Primary Examiner—Sara W. Crane
Assistant Examiner—D. Morin
Attorney, Agent, or Firm—Oblon, Spivak, McClelland, Maier & Neustadt

[57] ABSTRACT

In a high-breakdown-voltage diode, a high-concentration p-type layer is selectively formed in an n-type silicon layer, and a high-concentration n-type layer is formed in the same separate from the layer by a predetermined distance. An insulation film having a dielectric constant larger than silicon is formed on that portion of the n-type silicon layer which extends between the layers, for relaxing concentration of an electric field caused in the surface of the substrate.

7 Claims, 10 Drawing Sheets

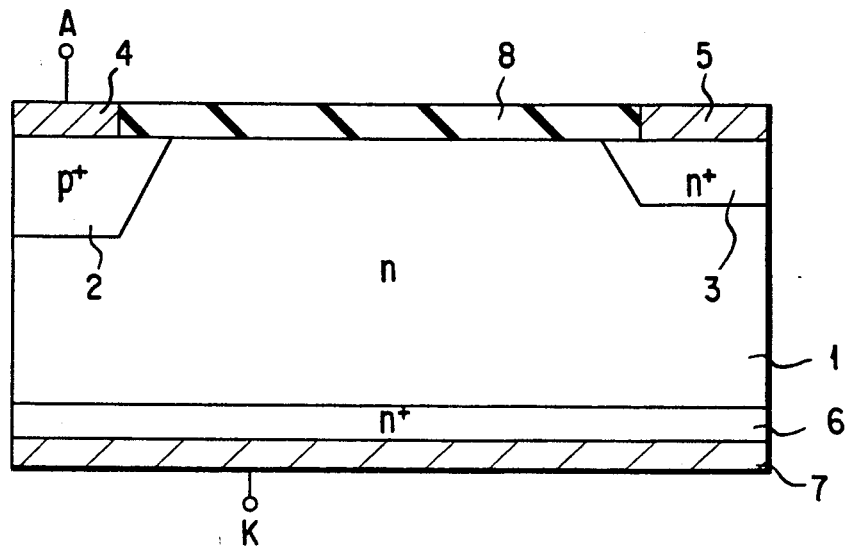
F I G. 1
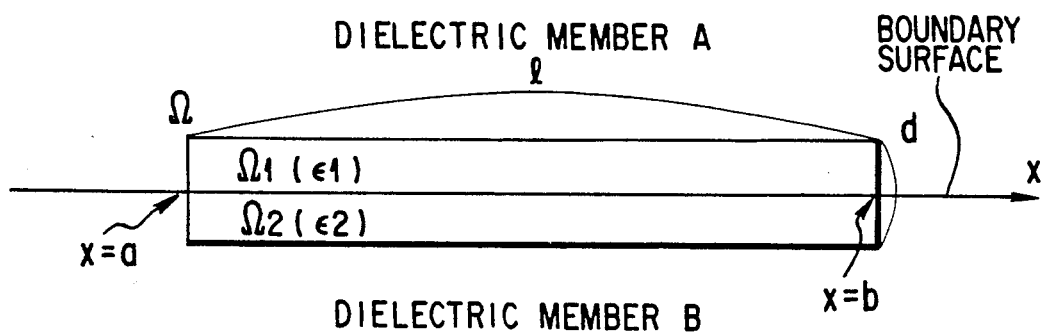
F I G. 2

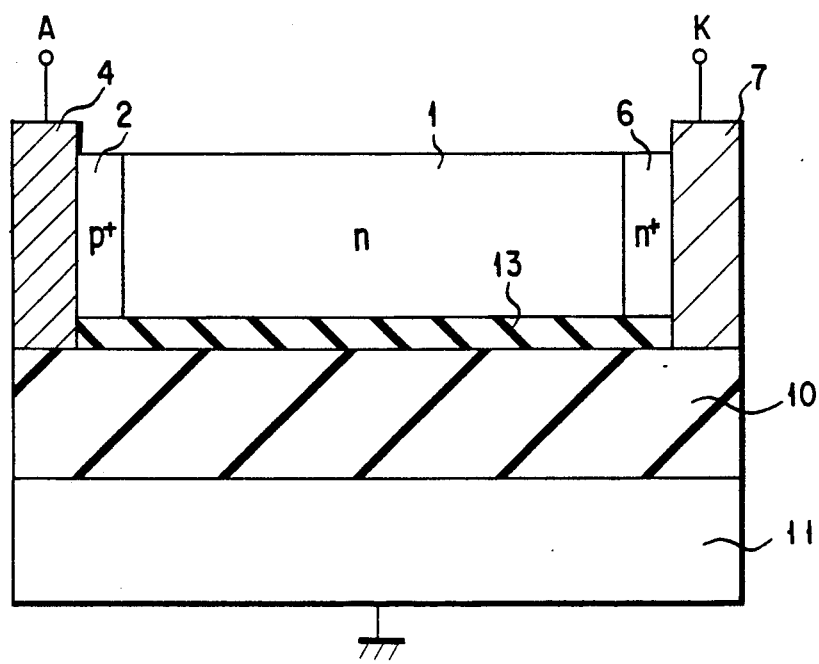
F I G. 5
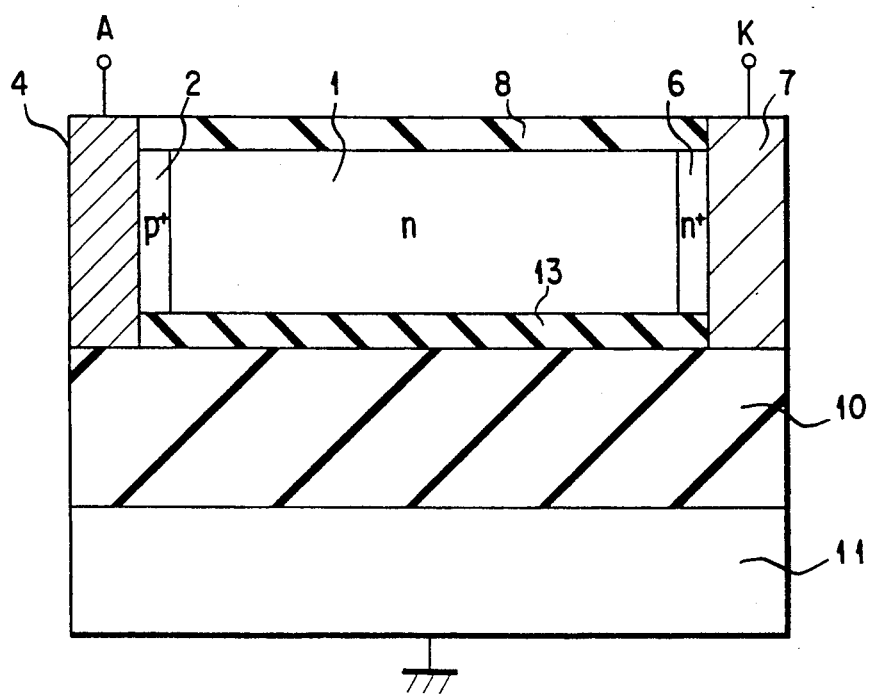
F I G. 6

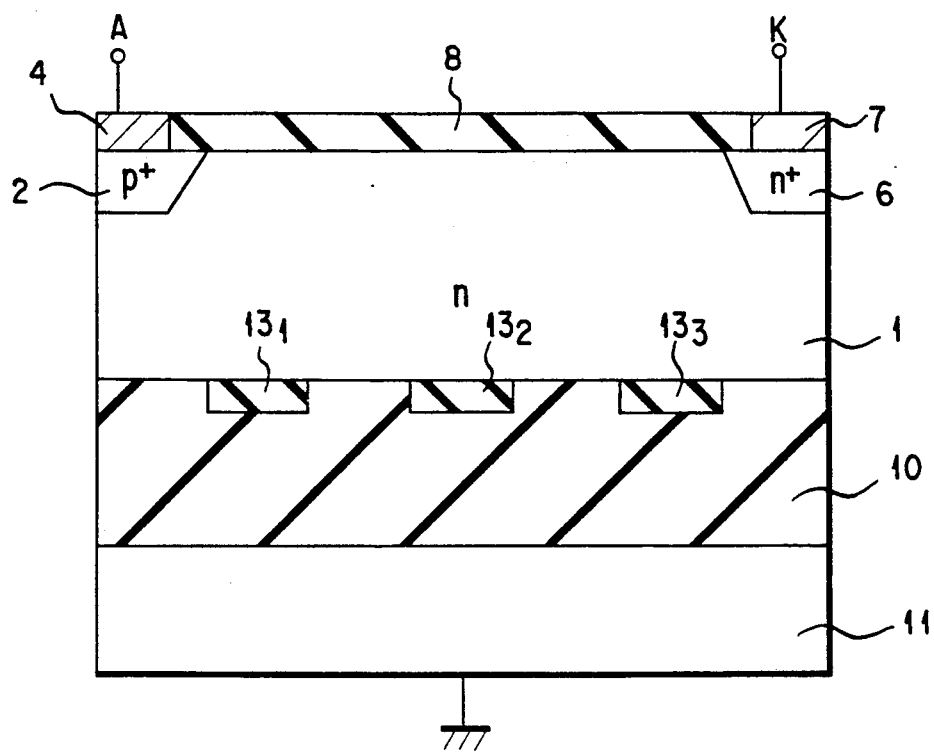
F I G. 7
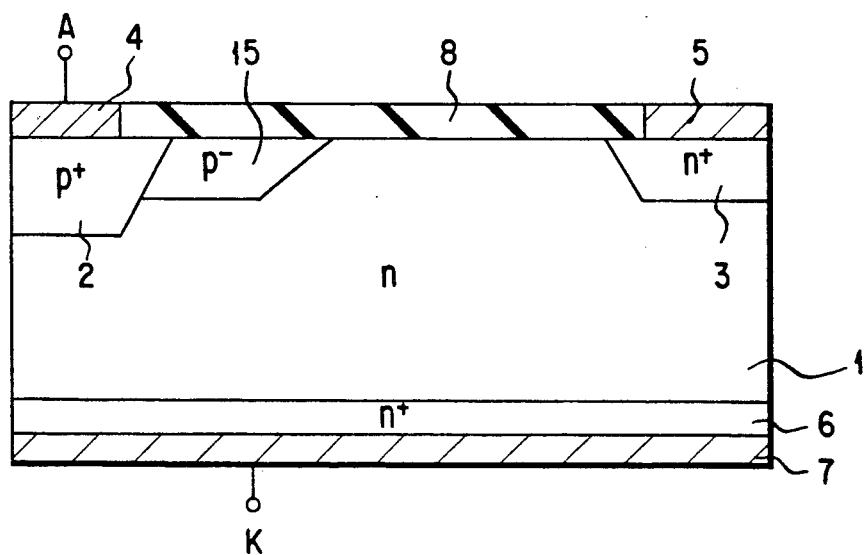
F I G. 8

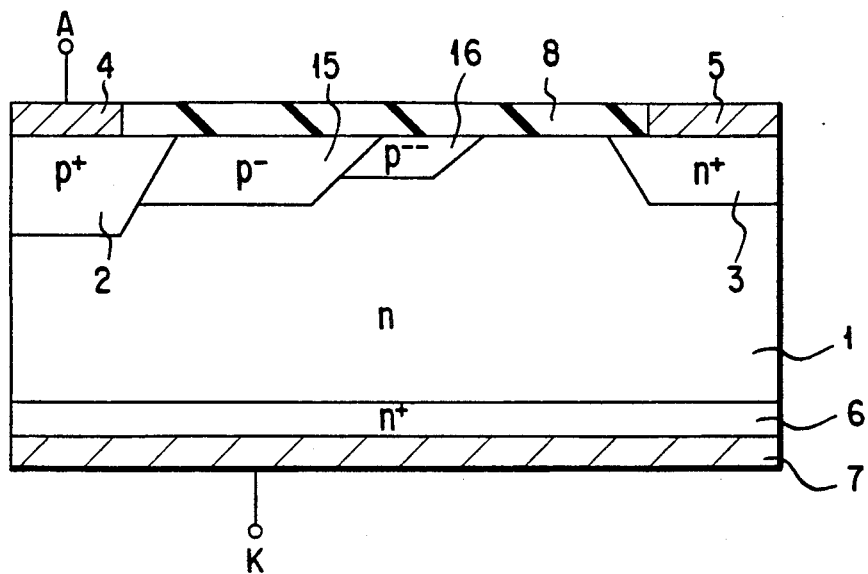
F I G. 9
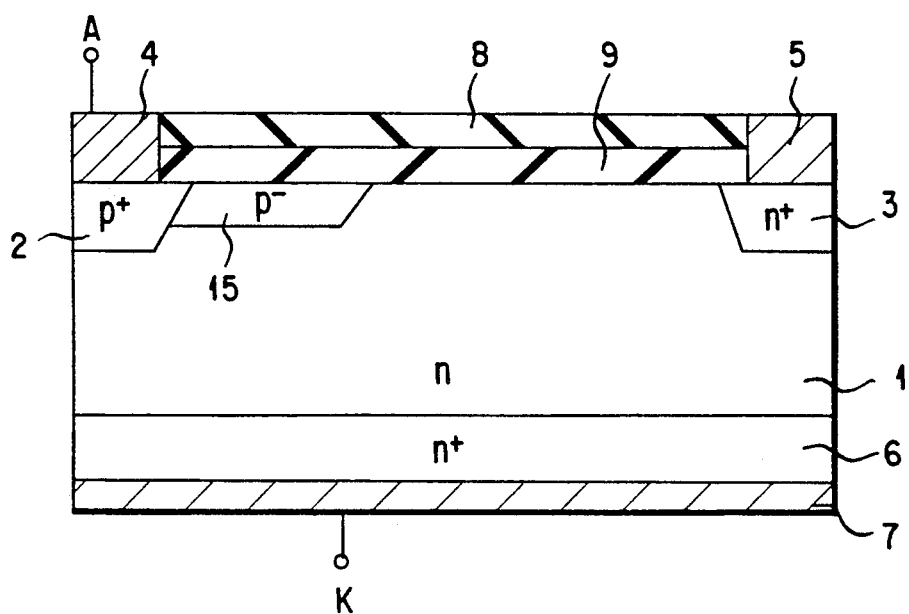
F I G. 10

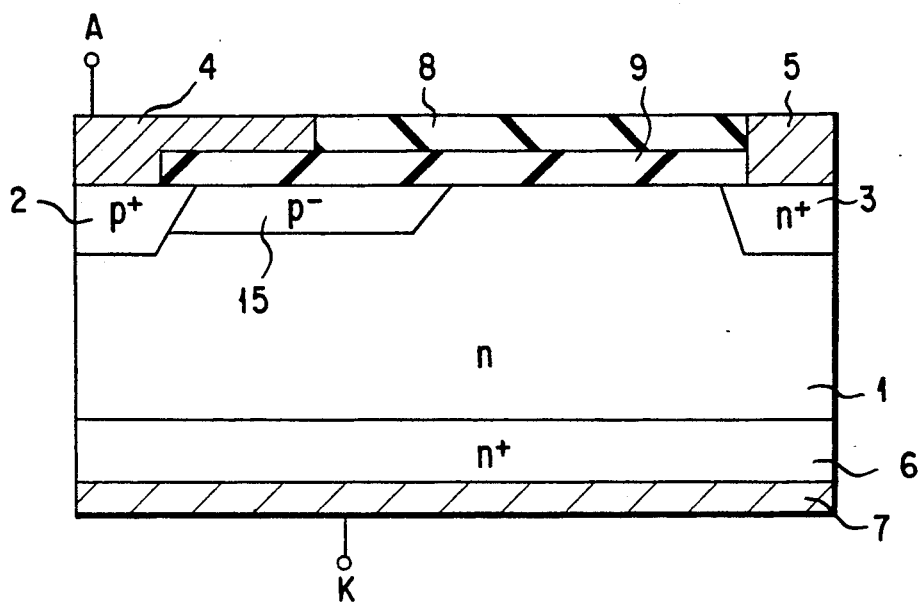
F I G. 11
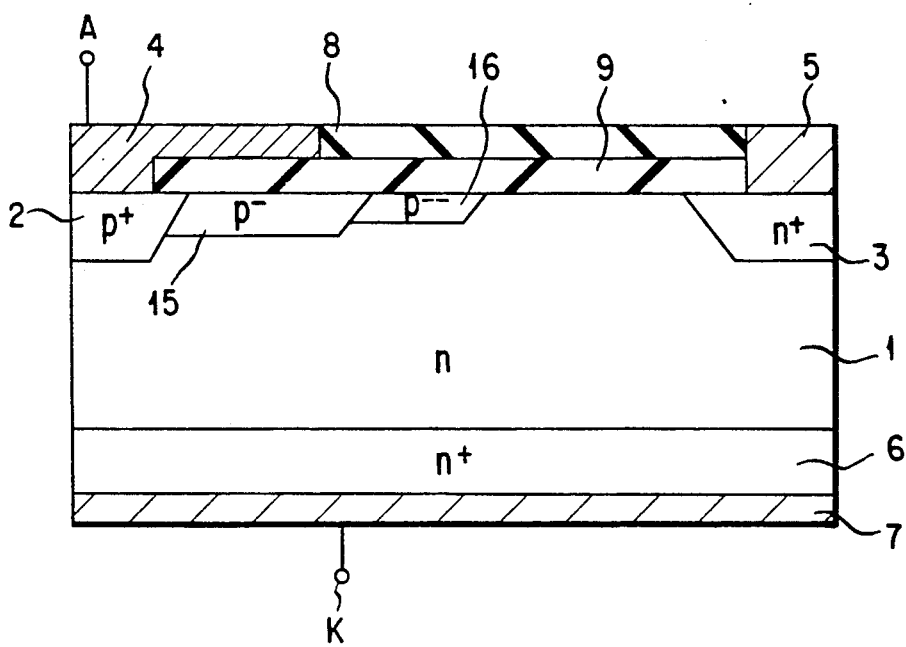
F I G. 12

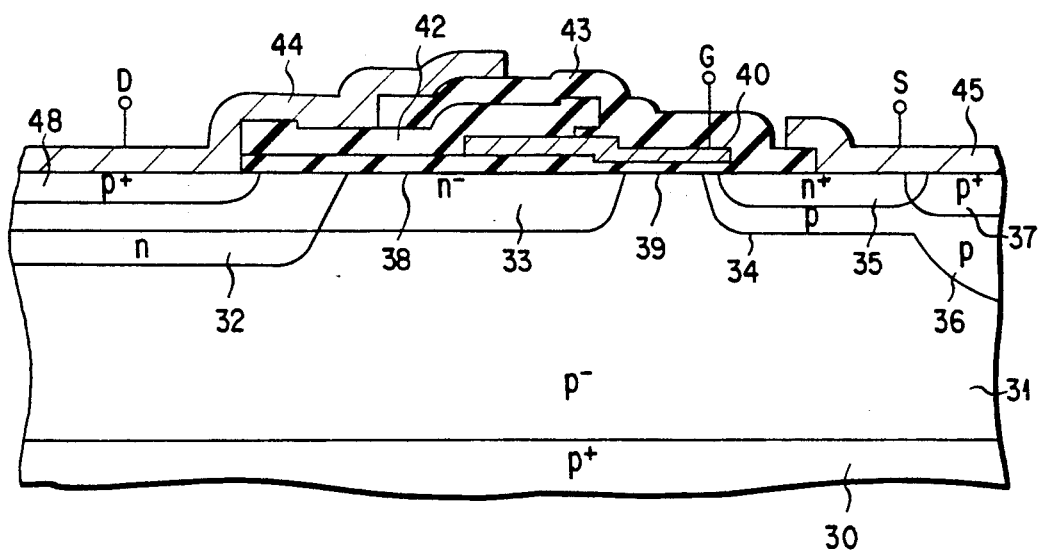
F I G. 13

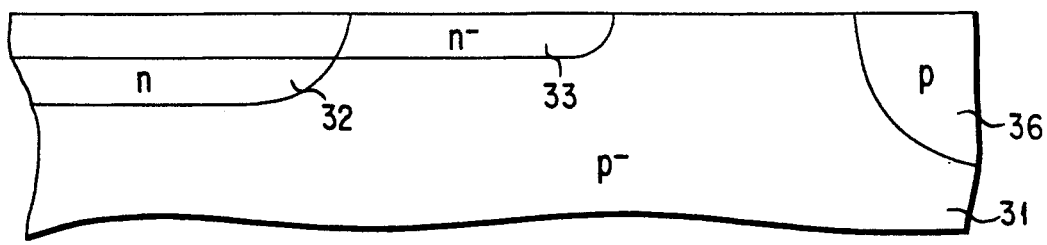
F I G. 14 A
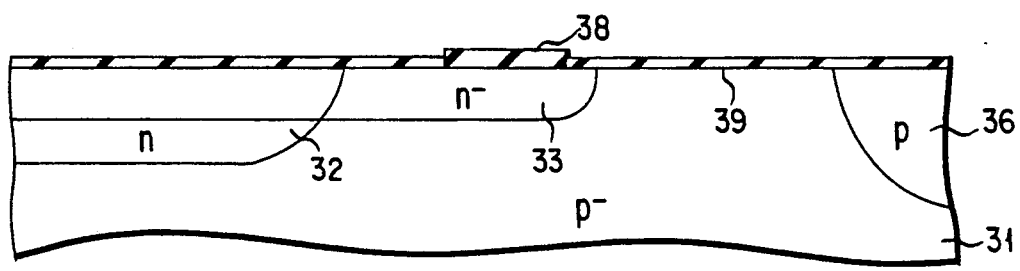
F I G. 14 B
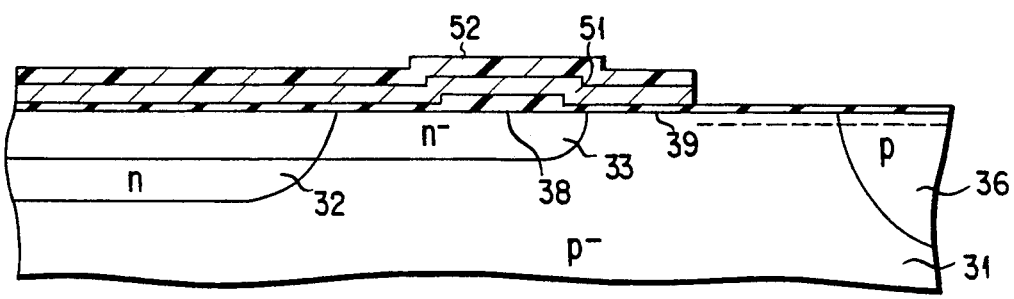
F I G. 14 C
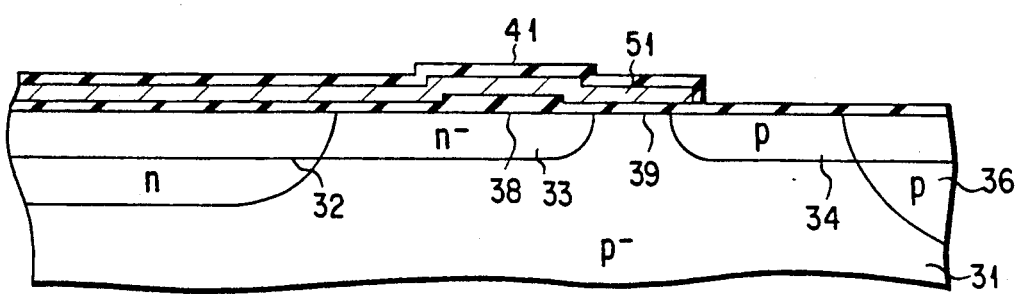
F I G. 14 D

HIGH-BREAKDOWN-VOLTAGE SEMICONDUCTOR ELEMENT

BACKGROUND OF THE INVENTION

1. Field of the Invention

This invention relates to a high-breakdown-voltage semiconductor element.

2. Description of the Related Art

A technique of providing a guard ring around an end pn-junction formed in an element region to be supplied with a high voltage is known as a method of increasing the breakdown voltage of a semiconductor element. The guard ring reduces the degree of electric field concentration at a tip portion of a depletion layer extending from the pn-junction, thereby increasing the breakdown voltage of the element. The effect of reducing the degree of the electric field concentration is obtained by optimally designing the depth of diffusion of the guard ring layer, the distance between the guard ring layer and a terminal region, and the distance between guard ring layers (if a plurality of guard ring layers are employed).

FIG. 16 shows an end portion of a high-breakdown-voltage diode having such a guard ring structure. A high-concentration p-type layer 2, which is to be an anode region, is formed in the upper surface of a high-resistance n-type silicon layer 1 (substrate). Further, a high-concentration n-type layer 3 is formed in the upper surface of the layer 1 separated from the layer 3 by a predetermined distance, for stopping the extension of a depletion layer. The layer 3 is provided with an electrode 5 for supplying a voltage identical to that of a cathode. High-concentration p-type layers 21 and 22 serving as guard rings are formed in the surface between the layers 2 and 3. An electrode 7 is formed on the lower surface of the layer 1 with a high-concentration n-type layer 6 interposed therebetween.

In such a structure, it is difficult to determine the distance between a guard ring layer and a terminal region, and the distance between guard ring layers in the case of employing a plurality of guard ring layers.

As described above, the conventional high-breakdown-voltage semiconductor element of a guard ring structure is hard to design.

SUMMARY OF THE INVENTION

This invention has been made in consideration of the above circumstances, and aims to provide a high-breakdown-voltage semiconductor element easy to design and having superior high-breakdown-voltage characteristics.

According to a first aspect of the invention, the high-breakdown-voltage semiconductor element has such a structure that a high-resistance semiconductor substrate of a first conductivity type has a second conductivity type layer of a high-concentration selectively formed therein and the first conductivity type layer of a high-concentration formed therein separated from the second conductivity type layer by a predetermined distance, the semiconductor element being characterized in that an insulation film having a dielectric constant larger than the semiconductor substrate is formed on the upper or lower surface of the high-resistance semiconductor substrate between the first and second conductivity type layers.

According to a second aspect of the invention, the high-breakdown-voltage semiconductor element is characterized by comprising first and second conductivity-type layers, first and second electrodes provided on the substrate such that they are located one on either side of a junction of the first and second conductivity-type layers, and an insulation film having a dielectric constant larger than the substrate and provided to connect the first and second electrode to each other.

As will be hereinafter explained in detail the invention utilizes the characteristic that the state of an electric field caused in the insulation film depends upon conditions given thereto without being influenced by the ambient state, when the dielectric constant of the insulation film is sufficiently large. That is, where an insulation film having a dielectric constant larger than the substrate is provided on the outside of a pn-junction, such as an end one, in an element having a structure as in the invention, a uniform electric field is formed in the insulation film, so that electric field concentration in a region near the insulation film can be avoided when a high reverse bias voltage is applied to the element.

Thus, the invention can provide a high-breakdown-voltage semiconductor element employing an insulation film capable of reducing the degree of electric field concentration caused in that portion of the substrate which is located in the vicinity of the insulation film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a cross sectional view, showing a high-breakdown-voltage diode according to a first embodiment of the invention;

FIG. 2 is a view, useful in explaining a reduction in the degree of concentration of an electric field by virtue of an insulating film having a large dielectric constant;

FIG. 5 is a cross sectional view, showing a high-breakdown-voltage diode according to a fourth embodiment of the invention;

FIG. 6 is a cross sectional view, showing a high-breakdown-voltage diode according to a fifth embodiment of the invention;

FIG. 7 is a cross sectional view, showing a high-breakdown-voltage diode according to a sixth embodiment of the invention;

FIG. 8 is a cross sectional view, showing a high-breakdown-voltage diode according to a seventh embodiment of the invention;

FIG. 9 is a cross sectional view, showing a high-breakdown-voltage diode according to an eighth embodiment of the invention;

FIG. 10 is a cross sectional view, showing a high-breakdown-voltage diode according to a ninth embodiment of the invention;

FIG. 11 is a cross sectional view, showing a high-breakdown-voltage diode according to a tenth embodiment of the invention;

FIG. 12 is a cross sectional view, showing a high-breakdown-voltage diode according to an eleventh embodiment of the invention, FIG. 13 is a cross sectional view, showing an IGBT (Insulated Gate Bipolar Transistor) according to a twelfth embodiment of the invention;

FIGS. 14A–14G are cross sectional views, showing the manufacturing procedure of the IGBT shown in FIG. 13;

DETAILED DESCRIPTION OF THE PREFERRED EMBODIMENTS

Figure 3:
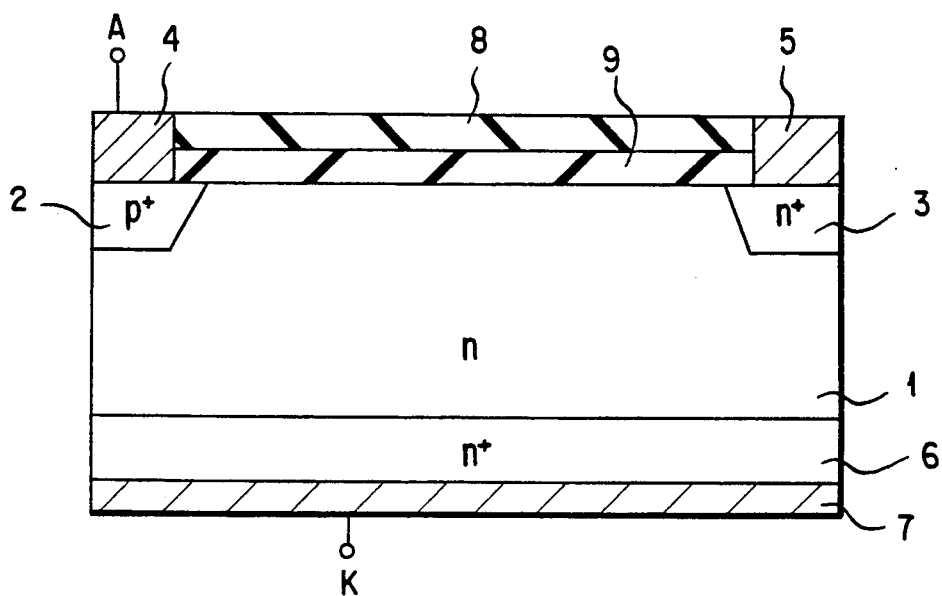
FIG. 3 is a cross sectional view, showing a high-breakdown-voltage diode according to a second embodiment of the invention.

The embodiments of the invention will be explained with reference to the accompanying drawings.

FIG. 1 shows a high-breakdown-voltage diode according to a first embodiment of the invention. A high-concentration p-type layer 2 serving as an anode terminal is selectively formed in the surface of a high-resistance n-type silicon layer (substrate) 1, and a high-concentration n-type layer 3 for stopping the extension of a depletion layer is formed in the surface, separated from the layer 2 by a predetermined distance. An anode electrode 4 and an electrode 5 supplying a voltage identical to that of a cathode are formed on the layers 2 and 3, respectively. An insulation film 8 made of TiO$_2$ and having a dielectric constant larger than that of Si is formed on the upper surface of the n-type silicon layer 1 between the electrodes 4 and 5. A cathode electrode 7 is formed on the lower surface of the layer 1 with a high-concentration n-type layer 6 interposed therebetween.

When a reverse bias voltage is applied to the above high-breakdown-voltage diode between the anode and cathode electrodes 4 and 7, and between the electrodes 4 and 5, a depletion layer grows from the high-concentration p-type layer 2 into the n-type silicon layer 1. If the dielectric constant of the insulation film 8 is sufficiently larger than that of silicon, an electric field caused in the film 8 when the reverse bias voltage is applied is determined by the electrodes 4 and 5 irrespective of the ambient conditions. That is, the electric field is uniform in the horizontal direction, i.e., has a uniform potential gradient. As a result, the degree of concentration of the electric field is reduced in that portion of the silicon layer 1 which is located under the insulation film 8.

The effect of the insulation film 8 will be explained referring to FIG. 2. FIG. 2 shows a state in which a dielectric member A having a dielectric constant $\epsilon_1$ is in contact with a dielectric member B having a dielectric constant $\epsilon_2$. As regards a fine region $\Omega$ members A and B, the following equation (1) can be obtained by using the Gauss' theorem:

$$\int_{\partial\Omega} \epsilon E \cdot nds = Q \tag{1}$$

n; outward unit vector perpendicular to surface of region $\Omega$ where $\Omega$ represents the total charge accumulated in the region $\Omega$. If the thickness d of the region $\Omega$ is sufficiently smaller than the length l of the region, the equation (1) can be replaced with the following equation (2):

$$\int_a^b \epsilon_1 E \cdot ndx + \int_b^a \epsilon_2 E \cdot ndx = \sigma l \tag{2}$$

where $\epsilon_1$ represents the dielectric constant of the portion of the region $\Omega_1$ on the side of the dielectric member A, $\epsilon_2$ the dielectric constant of the portion of the region $\Omega_2$ on the side of the dielectric member B, and $\sigma$ the density of charge accumulated in a line extending between a and b. The following equation (3) is obtained by dividing each side of the equation (2) by $\epsilon_2$:

$$\frac{\epsilon_1}{\epsilon_2}\int_a^b E \cdot ndx + \int_b^a E \cdot ndx = \frac{\sigma l}{\epsilon_2} \tag{3}$$

If $\epsilon_2$ is sufficiently larger than $\epsilon_1$ and than $\sigma l$, then the first term of the left side and the term of the right side will be very much smaller than the second term of the left side. Thus, the following equation (4) can be obtained approximately:

$$\int_a^b E \cdot ndx = 0 \tag{4}$$

From the equation (4), the following equation (5) is obtained:

$$\frac{\partial \psi}{\partial n} = 0 \tag{5}$$

where $\Psi$ represents the potential. This equation (5) indicates a condition for a reflection-type boundary. Specifically, where $\epsilon_2$ is sufficiently larger than $\epsilon_1$ and than $\sigma l$, the internal electric field caused in the region $\Omega_2$ of the dielectric member B is determined by only a fixed boundary condition applied to the region, without being affected by the dielectric member A.

The electric-field concentration-reducing effect of the invention is similar to that of a so-called field plate using a high-resistance film such as an SIPOS. However, the invention is basically different from the field plate in that the former utilizes a uniform electric field formed in the insulation film, while the latter utilizes potential distribution obtained by causing a very small amount of current to flow. To obtain the above effect of the invention, the dielectric constant of the insulation film must be sufficiently larger than that of silicon as the element material, i.e., be large enough to substantially satisfy the equation (4). Practically, it is preferable to use an insulation material having a dielectric constant five times larger than silicon. TiO$_2$, BaTiO$_3$, or the like is used as the insulation material. Further, it is more preferable to use an insulation film having a dielectric constant ten times larger than silicon.

FIGS. 3-12 are cross sectional views, showing high-breakdown-voltage diodes according to 2nd-11th embodiments of the invention. In these figures, like elements are designated by like signs, and duplication of explanation is avoided.

FIG. 3 shows a second embodiment of the invention, which has a basic structure similar to the first embodiment shown in FIG. 1, and a silicon oxide film 9 interposed between the insulation film 8 of a large dielectric constant and n-type silicon layer 1 of high resistance. Also in the second embodiment, the electric field in the insulation film 8 has uniform potential distribution when a reverse bias voltage is applied, which reduces the degree of concentration of an electric field extending into the silicon layer 1 through the oxide film 9. The thickness of the oxide film 9 is preferably less than 1 $\mu$m.

Figure 4:
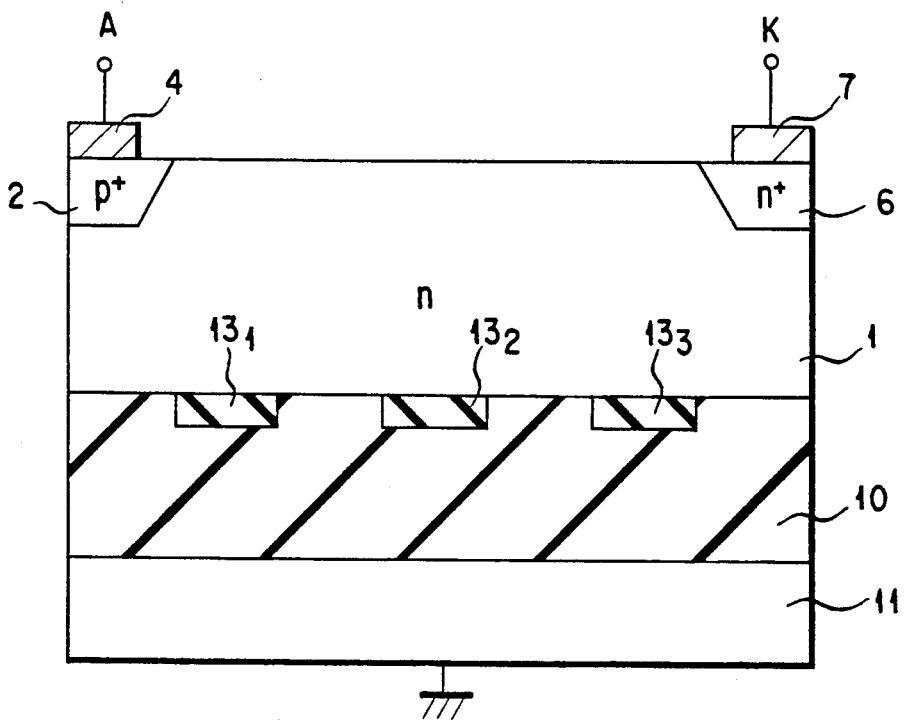
FIG. 4 is a cross sectional view, showing a high-breakdown-voltage diode according to a third embodiment of the invention.

FIG. 4 shows a third embodiment of the invention, which employs insulation films 13 ($13_1$, $13_2$, $13_3$) having a large dielectric constant. The diode according to this embodiment has a dielectric isolation structure obtained, for example, by adhering a second silicon substrate 11 to the first silicon layer 1 with a silicon oxide film 10 interposed therebetween. A plurality of insulation films 13 of a large dielectric constant are formed in boundary portions between the silicon layers 1 and 10. The reason why a plurality of insulation films 13 are formed in the diode is that they are not connected to the anode and cathode electrodes 4 and 7.

In the above structure, when the n-type silicon layer 1 becomes a complete depletion layer at the time of applying a reverse bias voltage thereto, the entire voltage is applied to that portion of the depletion layer which extends between the high-concentration p-type layer 2 and high-concentration n-type layer 6. At this time, the potentials of the insulation films 13, which are in a floating state, are determined depending upon the positions thereof, and the degree of electric field in each insulation film 13 is sufficiently lower than in the ambient circumstance. Accordingly, in a bottom portion of the silicon layer 1, the potential varies in stepwise such that it is flattened in the insulation films 13 in the horizontal direction. Thus, concentration of an electric field caused in the insulation films 13 by the influence of the side of the substrate 11 is relaxed, thereby providing high-breakdown-voltage characteristics.

FIG. 5 shows a fourth embodiment of the invention which employs an insulation film 13 formed on over an entire lower surface of the n-type silicon layer 1. In this embodiment, the both opposite ends of the insulation film 13 are connected to an anode electrode 4 and a cathode electrode 7 which extend to the bottom of the element. For the same reason described in the case of FIG. 1 where the insulation film 8 is provided on the upper surface of the element, concentration of an electric field in a lower portion of the layer 1 is relaxed.

FIG. 6 shows a fifth embodiment which is a substantial combination of the structures shown in FIGS. 1 and 5. In the fifth embodiment, insulation films 8 and 13 of a large dielectric constant are formed on the lower and upper surfaces of an end portion of the n-type silicon layer 1, respectively, thereby providing a diode having a higher breakdown voltage.

FIG. 7 shows a sixth embodiment which is a combination of the structures of FIGS. 1 and 4. This embodiment also provides superior high-breakdown-voltage characteristics.

FIG. 8 shows a seventh embodiment, in which a low-concentration p⁻-type layer 15 is formed, in the upper surface of the n-type high resistance silicon layer (substrate) 1, around and in contact with a high-concentration p⁺-type layer 2 selectively formed as an anode element region in the upper surface of the layer 1. The diode according to this embodiment also has a high breakdown voltage, since concentration of an electric field caused in the upper surface of the high-resistance silicon layer when a reverse bias voltage is applied is relaxed.

FIG. 9 shows an eighth embodiment based on the structure of FIG. 8. This embodiment differs from the FIG. 8 embodiment only in that a p—type layer 16 having an impurity concentration lower than the low-concentration p⁻-type layer 15 formed in contact with the p⁺-type layer 2, is formed in contact with the layer 15.

In the eighth embodiment, electric field concentration at a bottom corner of the p⁺-type layer 2 can be more relaxed. As a result, a depletion layer formed in the n-type layer at the time of application of a reverse bias voltage has a shape gradually decreasing in thickness from the surface and disappearing as the distance from the p⁺-type layer 2 increases. Thus, the breakdown voltage is effectively enhanced as compared with the seventh embodiment.

FIG. 10 shows a ninth embodiment, which differs from the structure of FIG. 3 only in that a low-concentration p⁻-type layer 15 is formed, in the upper surface of the n-type high-resistance silicon layer (substrate) 1, around and in contact with the high-concentration p⁺-type layer 2 as an anode terminal region. The diode according to this embodiment also has a high breakdown voltage, since concentration of an electric field caused in the upper surface of the high-resistance silicon layer is relaxed when a reverse bias voltage is applied.

FIG. 11 shows a tenth embodiment, which differs from the structure of FIG. 10 in that the anode electrode 4 is formed to cover the low-concentration p⁻-type layer 15. The diode according to this embodiment also has a high breakdown voltage, since concentration of an electric field caused in the upper surface of the high-resistance silicon layer is relaxed when a reverse bias voltage is applied.

FIG. 12 shows an eleventh embodiment, which differs from the FIG. 11 structure in that a p—type layer 16 having an impurity concentration lower than the low-concentration p⁻-type layer 15 formed in contact with the p⁺-type layer 2, is formed in contact with the layer 15.

In the eleventh embodiment, electric field concentration at a bottom corner of the p⁺-type layer 2 is further relaxed, and a depletion layer formed in the n-type layer 1 has a shape gradually decreasing in thickness from the surface and disappearing as the distance from the p⁺-type layer 2 increases. Thus, the breakdown voltage is effectively enhanced as compared with the seventh embodiment.

Though the above-described embodiments relate to pn-junction diodes, the invention is applicable also to various high-breakdown-voltage planar elements such as a MOSFET, an IGBT, a bipolar transistor, a thyristor, which include a diode structure similar to that employed in the above embodiments.

Then, an embodiment will be explained in which the invention is applied to an IGBT.

FIG. 13 shows an essential part of an IGBT according to a twelfth embodiment, and FIGS. 14A-14G show the manufacturing procedure thereof. The structure of the IGBT will be explained based on the procedure.

First, a deep p+-type layer 36 is formed by diffusion in the upper surface of a p--type silicon layer 31 having a p+-type layer 30 (see FIG. 13) formed on its lower surface. Similarly, an n-type layer 32 serving as n-type base layer and an n--type layer 33 extending around and in contact with the former are formed in that portion of the upper surface of the layer 31 which is located closer to the center than the layer 36 (FIG. 14A).

Thereafter, a thick field oxide film 38 is formed on the overall surface of the layer 31, and then selective etching is performed. Subsequently, a gate oxide film 39 is formed on an exposed portion of the silicon layer 31. (FIG. 14B)

A polycrystal silicon film 51 as gate electrode material is formed on the overall surface of the resultant structure. Subsequently, a photoresist pattern 52 is formed on the film 51, and the film 51 is selectively etched. Ions of boron are injected into openings in the film 51. (FIG. 14C)

Then, a p-type base layer 34 is formed by performing thermal drive-in diffusion of the injected boron ions. Simultaneously, an oxide film 41 is formed on the surface of the element. (FIG. 14D)

Figure 14E:
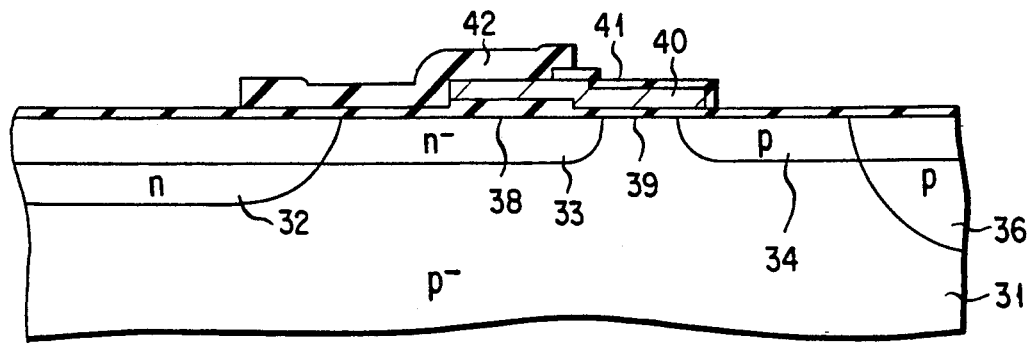

Thereafter, a gate electrode 40 is formed by selectively etching those extra portions of the polycrystal silicon film 51 which are located on the drain side of the element, thereby forming a gate electrode 40. At this time, the oxide film 41 is removed with part thereof left, thereby exposing part of the electrode 40. Subsequently, an insulation film 42 of a large dielectric constant is provided on the resultant structure such that it extends from those portions of the field oxide film 38 which lie on the n-type base layer 32 and n--type layer 33, to the exposed portion of the gate electrode 40. (FIG. 14E)

Figure 14F:
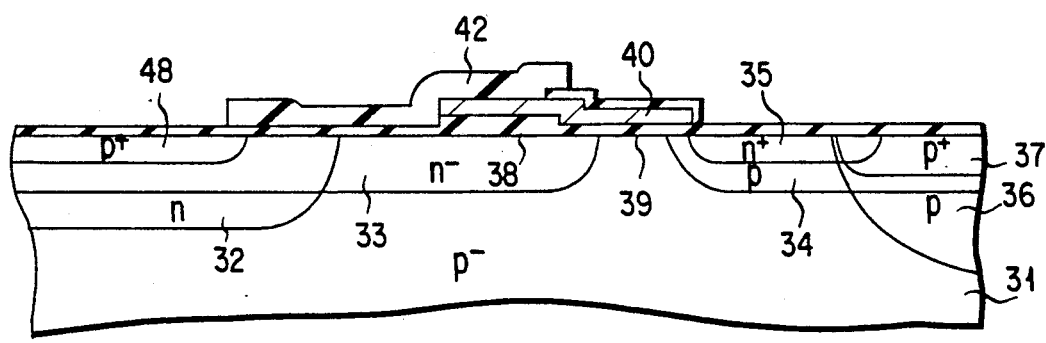

Thereafter, a p+-type layer 48 and an n+-type layer 35 serving as the drain and source of the element, respectively, are formed using the gate electrode 40 and dielectric insulation film 42 as part of a mask. Further, a p+-type layer 37 is formed by diffusion on the side of the source so as to reduce the contact resistance. (FIG. 14F)

Figure 14G:
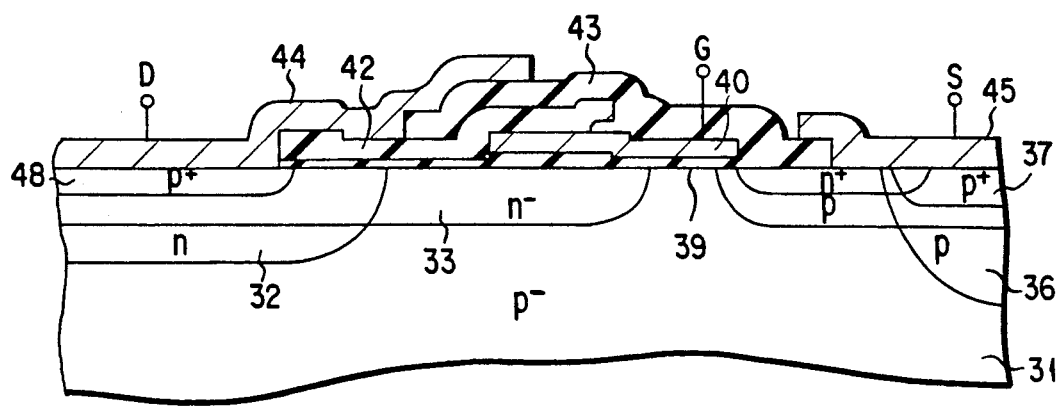

Then, an insulation film 43 is deposited all over the resultant structure, and contact holes are formed, followed by forming drain and source electrodes 44 and 45. The drain electrode 44 is formed such that it contacts the dielectric insulation film 4 and part of it is positioned above the gate electrode. (FIG. 14G)

In the IGBT constructed as above, when a gate circuit of a low-output impedance is connected between the gate and source, and a positive voltage is applied, a potential inclination uniform in the horizontal direction occurs in the insulation film of a large dielectric constant having both opposite ends provided with drain and gate potentials, respectively. Accordingly, electric field concentration in the element is relaxed, and local electric field concentration is prevented in the vicinity of the source junction. Further, since an electric field is forcibly formed in the insulation film 42, a depletion layer extends also from the surface of the n--type layer 33. That is, a complete depletion layer is formed in the layer 33 even when the impurity concentration thereof is higher than in the case of the conventional element, and therefore satisfactory high-breakdown-voltage characteristics can be obtained.

Figure 15:
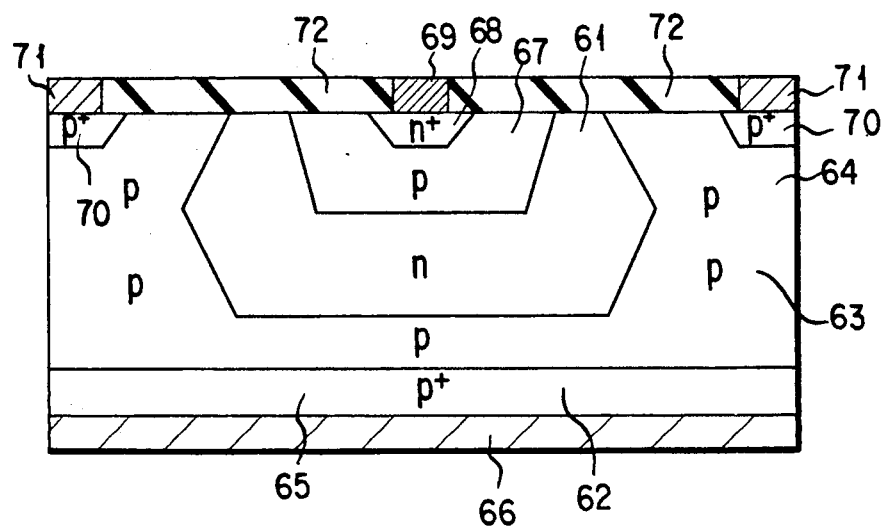
FIG. 15 is a cross sectional view, showing a thyrister according to a thirteenth embodiment of the invention.
Figure 16:
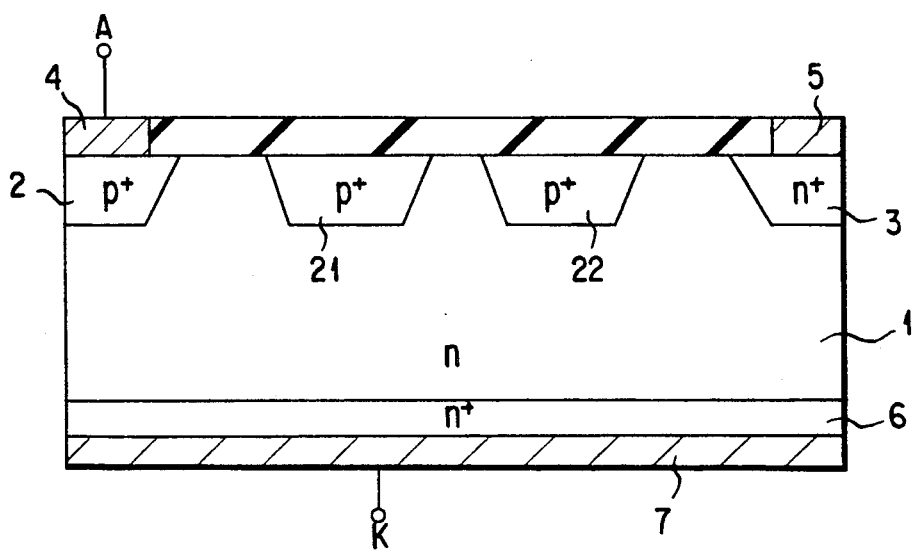
FIG. 16 is a cross sectional view, showing a conventional high-breakdown-voltage diode.

FIG. 15 shows a thirteenth embodiment, in which the invention is applied to a thyrister structure. In this embodiment, a p-type layer 62 is formed in the lower surface of a high-resistance n-type silicon substrate 61. P-type layers are selectively formed in the substrate 61 from the upper and lower surfaces.

A high-concentration p+-type layer 65 is formed in the lower surface of the substrate 61, and an electrode 66 is formed on the lower surface of the resultant structure.

A p-type layer 67 is selectively formed in that portion of the n-type substrate which is surrounded by the p-type layers 62, 63, and 64. Also, a high-concentration n+-type layer 68 is selectively formed in the surface of the p-type layer 67, and an electrode 69 is formed on the layer 68. A high-concentration n+-type layer 70 is selectively formed in the surface of the p-type layer 64, and an electrode 71 is formed on the layer 70. An insulator 72 having a large dielectric constant extends between the electrodes 69 and 71.

In the thirteenth embodiment, when a bias voltage of 0 is applied to the electrode 66 and a positive bias voltage is applied to the electrode 69, a reverse bias voltage is applied to the junction between the layers 67 and 68. Similarly, a reverse bias voltage is applied to the junctions between the n-type substrate 61 and p-type layers 62, 63, and 64. At this time, the dielectric member 72 of a large dielectric constant formed on the upper surface of the element can relax electric field concentration in the surface portion of the element, thereby obtaining a high breakdown voltage.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A high-breakdown-voltage MOSFET comprising:
    a semiconductor layer having a main surface;
    a first conductivity-type region and a second conductivity-type region which are formed in the semiconductor layer and along the main surface;
    first and second electrodes provides to the semiconductor layer such that they are located one on either side of a junction between the first and second conductivity-type regions;
    a first insulation film formed along the main surface and interposed between the first and second electrodes in contact therewith, the first insulation film being made of a material having a dielectric constant larger than a material constituting the semiconductor layer; and
    a second insulation film formed along the main surface and interposed between the semiconductor layer and the first insulation film;
    wherein the first electrode is a drain electrode formed on the first conductivity-type region, and the second electrode is a gate electrode formed on the second insulation film.

2. The MOSFET according to claim 1, wherein the second insulation film is formed of an oxide of the material constituting the semiconductor layer.

3. A high-breakdown-voltage IGBT comprising:
    a semiconductor layer having a main surface;
    a first region of a first conductivity-type, a second region of a second conductivity-type arranged in contact with the first region, a third region of the first conductivity-type arranged apart from the first and second regions, a fourth region of the second conductivity-type arranged between the third and second regions, and a channel region of the first conductivity-type interposed between the fourth and second regions, all of which are formed in the semiconductor layer and along the main surface;

a first electrode formed on and in contact with the first region;

a second electrode formed on and in contact with both of the third and fourth regions;

a gate insulation film and a gate electrode formed in that order on the channel region, the first and gate electrodes being located one on either side of a junction between the first and second regions; and a first insulation film formed along the main surface and interposed between the first and gate electrodes in contact therewith, the first insulation film being made of material having a dielectric constant larger than a material constituting the semiconductor layer.

4. The IGBT according to claim 3, further comprising a second insulation film formed along the main surface and interposed between the semiconductor layer and the first insulation film.

5. The IGBT according to claim 4, wherein said second and gate insulation films are integrally formed of an oxide of the material constituting the semiconductor layer.

6. The IGBT according to claim 5, wherein the second region comprises first and second portions arranged adjacent to the first and channel regions, respectively the first portion having an impurity density of the second conductivity-type higher than the second portion.

7. The IGBT according to claim 5, wherein the channel region comprises first and second portions arranged adjacent to the second and fourth regions, respectively, the second portion having an impurity density of the first conductivity-type higher than the first portion.

* * * * *

UNITED STATES PATENT AND TRADEMARK OFFICE
CERTIFICATE OF CORRECTION

PATENT NO. : 5,323,041
DATED : June 21, 1994
INVENTOR(S) : Ken'ichi MATSUSHITA, et al.

It is certified that error appears in the above-indentified patent and that said Letters Patent is hereby corrected as shown below:

On the title page, Item [22], the Filing Date should read as follows:

--Jun. 19, 1992--

Signed and Sealed this

Twentieth Day of September, 1994

Attest:

BRUCE LEHMAN

Attesting Officer

Commissioner of Patents and Trademarks